US007780782B2

(12) United States Patent
Huang et al.

(10) Patent No.: US 7,780,782 B2
(45) Date of Patent: Aug. 24, 2010

(54) METHOD AND APPARATUS FOR GROWING A RIBBON CRYSTAL WITH LOCALIZED COOLING

(75) Inventors: Weidong Huang, Acton, MA (US);
David Harvey, Westford, MA (US);
Richard Wallace, Acton, MA (US);
Scott Reitsma, Shrewsbury, MA (US)

(73) Assignee: Evergreen Solar, Inc., Marlborough, MA (US)

( * ) Notice: Subject to any disclaimer, the term of this patent is extended or adjusted under 35 U.S.C. 154(b) by 445 days.

(21) Appl. No.: 11/760,542

(22) Filed: Jun. 8, 2007

(65) Prior Publication Data
US 2008/0302296 A1 Dec. 11, 2008

(51) Int. Cl.
*C30B 15/34* (2006.01)
(52) U.S. Cl. ............... 117/21; 117/13; 117/213; 117/217
(58) Field of Classification Search ............ 117/21, 117/213, 217, 13
See application file for complete search history.

(56) References Cited

U.S. PATENT DOCUMENTS

| 3,124,489 A | * | 3/1964 | Vogel et al. ............ 117/26 |
| 4,217,165 A | | 8/1980 | Frosch et al. ............ 156/601 |
| 4,221,754 A | | 9/1980 | Nowak .................. 264/164 |
| 4,603,034 A | | 7/1986 | Vickery, III ............ 422/246 |
| 4,873,063 A | | 10/1989 | Bleil ...................... 422/250 |
| 6,413,313 B1 | | 7/2002 | Yoshida et al. .......... 117/200 |
| 6,814,802 B2 | | 11/2004 | Wallace, Jr. ............ 117/23 |
| 7,022,180 B2 | | 4/2006 | Wallace, Jr. ............ 117/13 |
| 2004/0083946 A1 | | 5/2004 | Wallace, Jr. ............ 117/16 |

OTHER PUBLICATIONS

R.L. Wallace, et al., *Thin Silicon String Ribbon for High Efficiency Polycrystalline Solar Cells*, IEEE, Sep. 30-Oct. 3, 1997, pp. 99-102.
Authorized Officer Maria Ruiz Martinez, *International Search Report and Written Opinion of the International Searching Authority*, International Searching Authority, International Application No. PCT/US2008/064854, Aug. 6, 2008, 12 pages.
Morrison, *Filament Guides for Silicon Ribbon Growth;* NASA Tech. Briefs, USA, vol. 9, No. 2, Feb. 1986, 5 pgs.
Zoutendyk et al., *Gas-Jet Meniscus Control in Ribbon Growth;* NASA Tech. Briefs, USA, vol. 7, No. 3, Mar. 1984, 29 pgs.

* cited by examiner

*Primary Examiner*—Robert M Kunemund
(74) *Attorney, Agent, or Firm*—Sunstein Kann Murphy & Timbers LLP

(57) ABSTRACT

A method of growing ribbon crystal provides a crucible containing molten material, and passes at least two strings through the molten material to produce a partially formed ribbon crystal. The method then directs a fluid to a given portion of the partially formed ribbon crystal to convectively cool the given portion.

21 Claims, 6 Drawing Sheets

Fig. 1-Prior Art

METHOD AND APPARATUS FOR GROWING A RIBBON CRYSTAL WITH LOCALIZED COOLING

FIELD OF THE INVENTION

The invention generally relates to crystal growth and, more particularly, the invention relates to growth of ribbon crystals.

BACKGROUND OF THE INVENTION

Silicon wafers are the building blocks of a wide variety of semiconductor devices, such as solar cells, integrated circuits, and MEMS devices. For example, Evergreen Solar, Inc. of Marlboro, Mass. forms solar cells from silicon wafers fabricated by means of the well-known "ribbon pulling" technique.

The ribbon pulling technique uses proven processes for producing high quality silicon crystals. Such processes, however, may produce ribbon crystals having relatively thin areas that are prone to breaking. For example, FIG. 1 schematically shows a cross-sectional view of a part of a prior art ribbon crystal 10A. This cross-sectional view shows a so-called "neck region 12" that is thin relative to the thickness of the rest of the ribbon crystal 12.

To avoid this problem, conventional ribbon pulling furnaces may have meniscus shapers for varying the shape and height of the interface between the growing ribbon crystal and the molten silicon, thus eliminating the neck region 12. Although beneficial for this problem, meniscus shapers necessarily must be cleaned at regular intervals to ensure appropriate furnace operation. Consequently, the entire crystal growth process must be suspended to clean the meniscus shapers, thus reducing yield. Moreover, meniscus shaper cleaning requires manual/operator intervention, thus driving up production costs.

SUMMARY OF THE INVENTION

In accordance with one embodiment of the invention, a method of growing a ribbon crystal passes at least two strings through a molten material to produce a partially formed ribbon crystal. The method also convectively cools a given portion of the partially formed ribbon crystal.

The partially formed ribbon crystal has an edge that is generally defined by one of the strings, an inward portion spaced from the edge, and the given portion, which is between the edge and the inward portion. When convectively cooling, the method may cause the thickness of the given portion to be greater than the thickness of the inward portion. In some embodiments, convectively cooling may include varying the convection cooling to vary the location of the interface. The given portion consequently has a thickness that is a function of the location of the interface.

In various embodiments, convectively cooling is accomplished by directing a fluid stream toward the given portion. For example, a fluid delivery apparatus may direct the fluid stream to strike the given portion. In fact, the fluid stream also may contact a second portion of the partially formed ribbon crystal (after contacting the given portion) and also cool the second portion. In addition to convectively cooling the growing ribbon crystal, the fluid delivery apparatus may radiatively cool the given portion.

While growing, the partially formed ribbon crystal has a ribbon width. The given portion also may have a width that is no greater than about half the ribbon width.

In accordance with another embodiment of the invention, a method of growing ribbon crystal provides a crucible containing molten material, and passes at least two strings through the molten material to produce a partially formed ribbon crystal. The method then directs a fluid to a given portion of the partially formed ribbon crystal to convectively cool the given portion.

In accordance with other embodiments of the invention, an apparatus for forming a ribbon crystal has a crucible for containing molten material. The crucible forms a string hole for passing string through the molten material for growing a ribbon crystal. The apparatus also has a gas jet with an outlet port facing inwardly for directing a gas generally inwardly toward the growing ribbon crystal.

In some embodiments, the gas jet is horizontally spaced from the crucible. Moreover, in other embodiments, the apparatus has a second gas jet. The first gas jet directs gas in a first direction, and the second gas jet directs gas in a second direction. The first and second directions illustratively are different directions and generally parallel. For example, the first gas jet and second gas jet may produce respective gas streams that are generally coaxial.

Some embodiments also may include a string through the string hole and a growing ribbon crystal.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Figure 1:
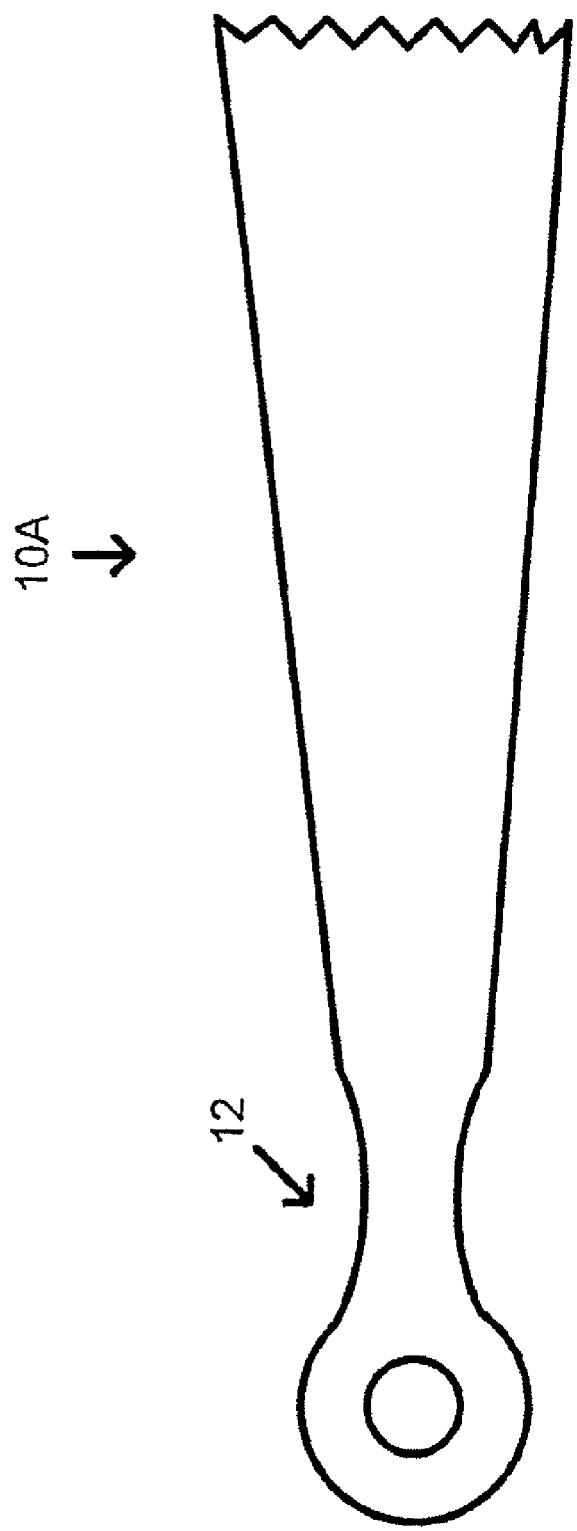
FIG. 1 schematically shows a partial cross-sectional view of a prior art ribbon crystal.

Illustrative embodiments of the invention form a ribbon crystal without a thin neck region, such as that shown in FIG. 1. Accordingly, the ribbon crystal should be less prone to breaking in that general region. To that end, various embodiments use convection cooling techniques to locally cool one or more specific areas of a growing ribbon crystal. Details of various embodiments are discussed below.

Figure 2:
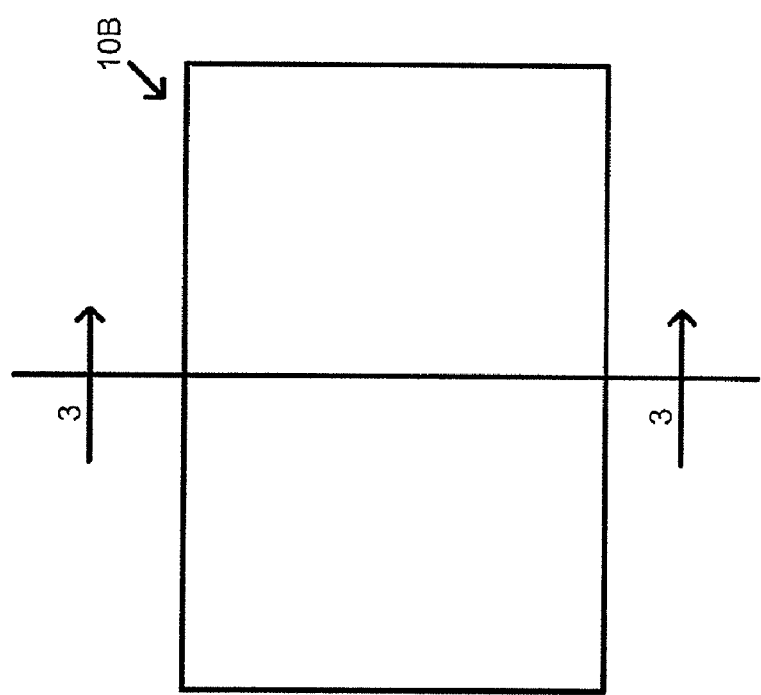
FIG. 2 schematically shows a top view of a ribbon crystal that may be produced in accordance with illustrative embodiments of the invention.

FIG. 2 schematically shows a ribbon crystal 10B configured in accordance illustrative embodiments of the invention. In a manner similar to other ribbon crystals, this ribbon crystal 10B has a generally rectangular shape and a relatively large surface area on its front and back faces. For example, the ribbon crystal 10B may have a width of about 3 inches, and a length of 6 inches. As known by those skilled in the art, the length can vary significantly depending upon where an operator chooses to cut the ribbon crystal 10B as it is growing. In addition, the width can vary depending upon the separation of its two strings 14 (see FIG. 3). Accordingly, discussion of specific lengths and widths are illustrative and not intended to limit various embodiments the invention. In addition, the thickness of the ribbon crystal 10B varies and is very thin relative to its length and width dimensions.

Figure 3:
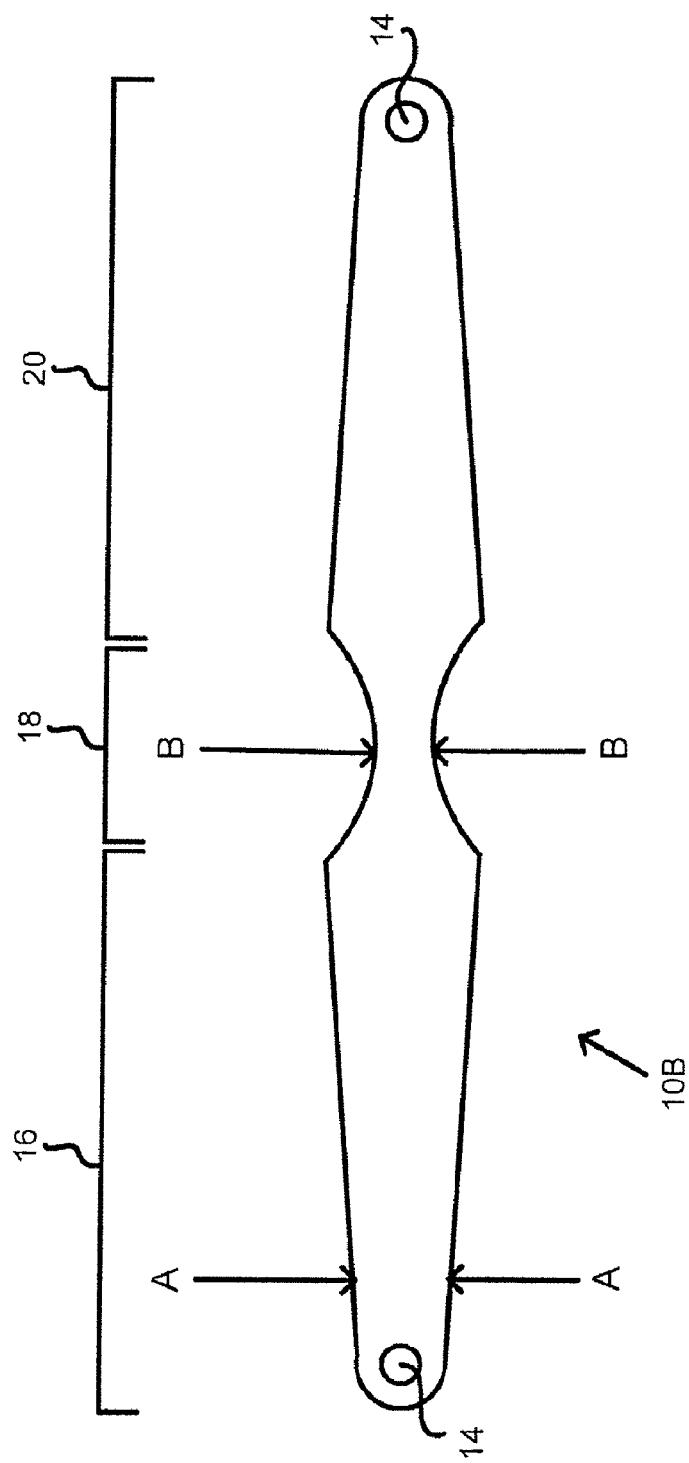
FIG. 3 schematically shows a cross-sectional view of the ribbon crystal of FIG. 2 across line 3-3.

More specifically, FIG. 3 schematically shows a cross-sectional view of the ribbon crystal 10B of FIG. 2 across line 3-3. As a preliminary matter, it should be noted that FIG. 3 is not drawn to scale. Instead, it should be considered a schematic drawing for descriptive purposes only. In particular, the ribbon crystal 10B is formed from a pair of strings 14 encapsulated by silicon (e.g., polysilicon). Although it is surrounded by silicon, the string 14 and the silicon outwardly of the string 14 generally form the edge of the ribbon crystal 10B.

The ribbon crystal 10B also may be considered to have three contiguous portions; namely, a first end section 16 having a first string 14 through it, a middle section 18, and a second end section 20 having a second string 14 through it. In illustrative embodiments, the middle section 18 makes up about seventy-five percent of the total length of the ribbon crystal 10B. The first and second end sections 16 and 20 thus together make up about twenty-five percent of the total length of the ribbon crystal 10B.

As shown, the thickness of the ribbon crystal 10B generally increases when traversing from the edge of the first end section 16 to the boundary of the first end section 16 and the middle section 18. The thickness then begins to decrease until about the general center of the middle section 18, and then increases from the general center of the middle section 18 to the boundary of the middle section 18 and the second end section 20. In a manner similar to the first end section 16, the thickness of the ribbon crystal 10B generally increases when traversing from the edge of the second end section 20 to the boundary of the second end section 20 and the middle section 18. Consequently, neither end section 16 or 20 has a fragile neck 12, such as that shown in FIG. 1.

As an example, the ribbon crystal 10B may be considered to have a first portion generally identified in FIG. 3 between arrows A-A (i.e., within the first section), and an inner portion similarly identified in FIG. 3 between arrows B-B (i.e., within the middle section 18). The first portion A-A, which is between the edge and the inner portion B-B, has a greater thickness than that of the inner portion B-B. For example, the first portion A-A may have a thickness of about 250 microns, while the inner portion B-B may have a thickness of about 200 microns. Of course, different portions of the ribbon crystal 10B may have similar relationships similar to the relationship between portions A-A and B-B. For example, another portion near the ribbon crystal edge may have a greater thickness than some more inward portion.

It should be noted that discussion of the relative thicknesses, dimensions, and sizes are illustrative and not intended to limit all embodiments of the invention. For example, the thickness of the end sections 16 and 20 may be substantially constant, while the middle section 18 increases. As another example, subject to manufacturing tolerances, the thickness may be substantially uniform across the entire ribbon crystal 10B, or the thicknesses may be alternatively larger and smaller within one of the sections 16, 18, or 20, or more than one of the sections 16, 18 and 20. As yet another embodiment, the two end sections together could make up more than half of the total length of the ribbon crystal 10B, while the middle section 18 makes up less than half of the total length of the ribbon crystal 10B.

Figure 4:
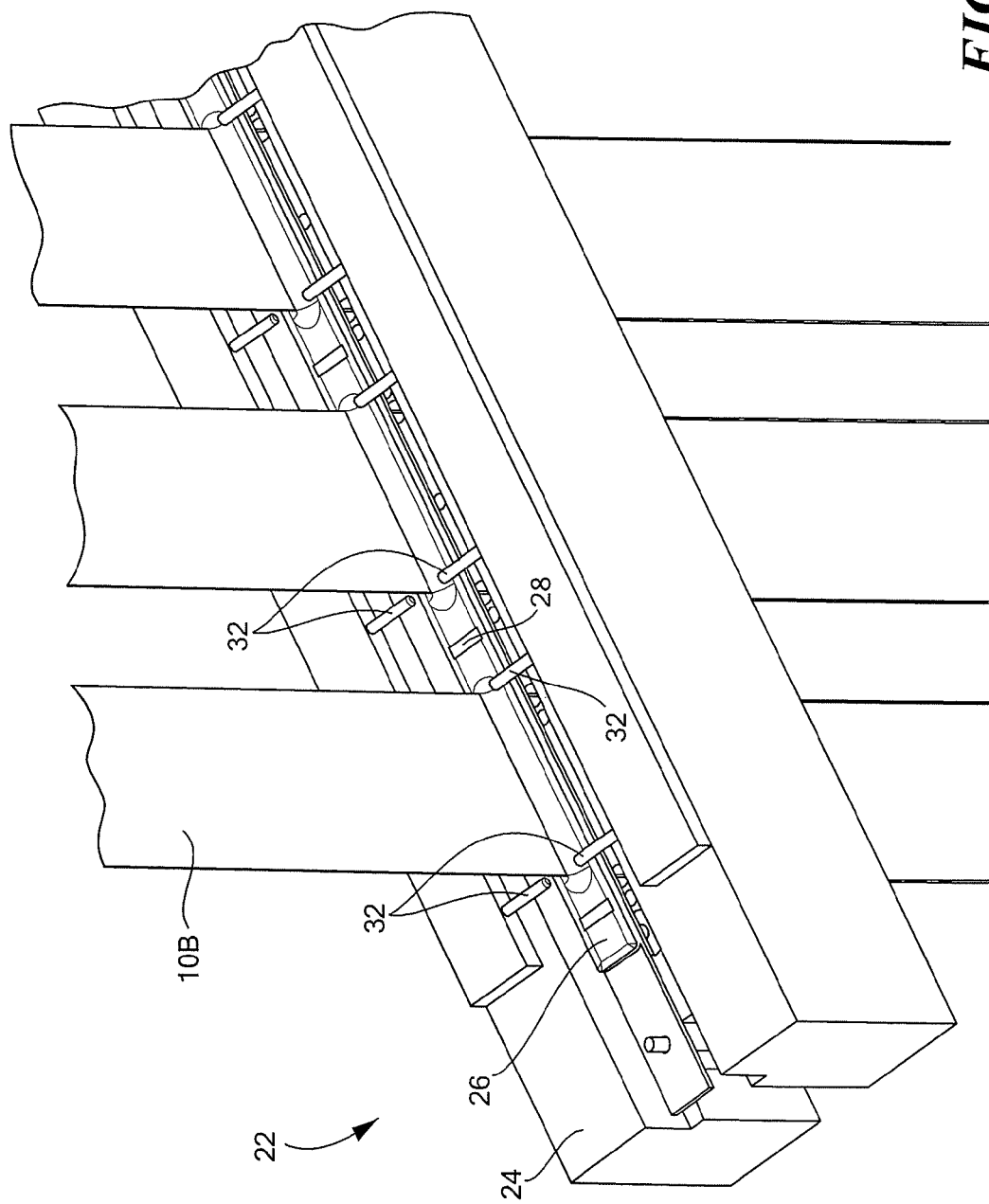
FIG. 4 schematically shows a portion of a ribbon crystal furnace implementing of illustrative embodiments of the invention.

Illustrative embodiments may use the furnace 22 shown in FIG. 4 to produce the ribbon crystal 10B shown in FIGS. 2 and 3. FIG. 4 schematically shows this furnace 22 while in use and thus, shows molten silicon and a ribbon crystals 10B being pulled from the molten silicon. Specifically, the furnace 22 shown in FIG. 4 has a support structure 24 that supports a crucible 26 containing the noted molten silicon. In addition, the furnace 22 also may have a plurality of cooling bars 28 that provide some radiative cooling effect. The cooling bars 28 are optional and thus, may be omitted from the furnace 22.

The crucible 26 forms a pair of string holes 30 (only one of which is shown) for receiving two high temperature strings 14 that ultimately form the edge area of a growing silicon ribbon crystal 10B. In some embodiments, the crucible 26 has multiple pairs of string holes 30 (e.g., four pairs of string holes 30) to grow multiple ribbon crystals 10B simultaneously.

The crucible 26 may be formed from graphite and preferably is resistively heated to a temperature capable of maintaining the molten silicon above its melting point. Moreover, the crucible 26 shown in FIG. 4 has a length that is much greater than its width. For example, the length of the crucible 26 may be three or more times greater than its width. Of course, in some embodiments, the crucible 26 is not elongated in this manner. For example, the crucible 26 may have a somewhat square shape, or a nonrectangular shape.

In accordance with illustrative embodiments, the furnace 22 has the capability of cooling the growing ribbon crystal 10B in a manner that substantially eliminates the fragile neck 12 problem discussed above with regard to FIG. 1. Specifically, the furnace 22 has a cooling apparatus that cools specific portions of the growing ribbon crystal 10B (e.g., the first and/or second end sections 16 and 20), thus effectively increasing its thickness in those areas.

To that end, the inventors were surprised to discover that convective cooling techniques could be employed to accomplish this goal. More particularly, the molten silicon typically is maintained at a very high temperature, such as at temperatures that are greater than about 1420 degrees C. For example, the molten silicon may be maintained at a temperature between 1420 degrees C. and 1440 degrees C. As understood by the inventors, those skilled in the art generally would not use convective cooling to cool something that approaches those temperatures.

The inventors were surprised to discover, however, that convective cooling suffices in this case because, among other reasons, each cooling apparatus cools only a very small portion of the growing ribbon crystal 10B. The total mass of such small areas correspondingly is very small and yet, compared to its thickness, has a relatively large surface area. Accordingly, given these conditions, the inventors discovered that convective cooling could suffice for the desired application.

Accordingly, to that end, the embodiment shown in FIG. 4 has a plurality of gas jets 32 with outlets for generally directing a gas toward a distinct portion of the growing ribbon crystal 10B. As shown, each growing ribbon crystal 10B has two associated pairs of gas jets 32. One pair of gas jets 32 cools the first end section 16 of the ribbon crystal 10B, while the second pair of gas jets 32 cools the second end section 20 of the ribbon crystal 10B. Each jet 32 in a pair illustratively cools opposite sides of substantially the same portion of the ribbon crystal 10B. Accordingly, the jets 32 in each pair shown in FIG. 4 direct gas flow in generally parallel but opposite directions. For example, the gas stream of one jet 32 in a pair may be generally coaxial with the gas stream produced by the other jet 32 in its pair (although the two streams do not mix due to the separation provided by the growing ribbon crystal 10B).

To improve control of the cooling function, the gas jets 32 preferably provide substantially columnar gas flow to the ribbon crystal 10B. To that end, illustrative embodiments use a relatively long tube relative to the inner diameter of its inner bore. For example, the ratio of the length of the tube to its inner diameter may be on the order of 10 or greater. The tube thus may have a substantially constant inner diameter of about 1 millimeter, and a length of about 12 millimeters.

The gas streams illustratively each directly strike a relatively small part of the ribbon crystal 10B. In fact, this relatively small part may be much smaller than the entire section/portion intended to be cooled, such as the first end section 16. For example, the general center of the columnar gas stream could be aimed to contact the ribbon crystal 10B about 1 millimeter vertically from the crystal edge, and about one millimeter horizontally above the interface of the molten silicon and the growing ribbon crystal 10B (discussed below and identified by reference number 34). Contact with this relatively small part, however, may increase the temperature of the gas to some extent, but not necessarily eliminate its subsequent cooling effect. Accordingly, after striking this small part of the ribbon crystal 10B, the gas migrates to contact another part of the ribbon crystal 10B, thus also cooling that other part by design. Eventually, the gas dissipates and/or the remaining gas heats up to a temperature that no longer has the ability to cool the ribbon crystal 10B. The gas thus may be considered to form a cooling gradient as it contacts the ribbon crystal 10B. Accordingly, by way of example, the gas jets 32 may cool substantially the entire first end section 16 of the ribbon crystal 10B with both this primary and secondary cooling effect.

The total size of the area being cooled depends upon a number of different factors. Among others, such factors may include the gas flow rate, gas type, jet 32 size, speed of the growing crystal 10B, temperature of the molten silicon, and the location of the gas jets 32.

Illustrative embodiments can use any of a number of types of gases and flow rates to control the localized thickness of the growing ribbon crystal 10B. For example, some embodiments use argon gas flowing at a rate of up to 40 liters per minute. The flow rate should be determined based upon a number of factors, including the distance from the outlet of the jet 32 to the growing ribbon crystal 10B, the desired cooling area of the ribbon crystal 10B, the mass of the growing ribbon crystal 10B, and the temperature of the gas. One should be mindful, however, to ensure that the flow rate is not so high that it could damage the growing ribbon crystal 10B. Accordingly, although a higher flow rate may improve cooling, it possibly can damage the ribbon crystal 10B.

Moreover, in the above example, the argon gas may be emitted from the jet 32 at a temperature between 100 and 400 degrees C. (e.g., 200 degrees C.). Of course, other gases having other characteristics may be used. Accordingly, discussion of argon and specific temperatures should not limit various aspects of the invention.

In addition to convectively cooling the growing ribbon crystal 10B, the gas jets 32 also may act as a source of radiative cooling. Specifically, in illustrative embodiments, the gas jets 32 are formed from material that effectively acts as a heat sink. For example, the gas jets 32 may be formed from graphite. Accordingly, when positioned in relatively close proximity to the growing ribbon crystal 10B, the gas jet material locally absorbs heat, thus furthering the cooling effect on the desired part of the growing ribbon crystal 10B. Each gas jet 32 therefore may be considered as providing two sources of cooling; namely, convective cooling and radiative cooling.

In alternative embodiments, however, the gas jets 32 are not formed from a material capable of radiatively cooling the growing ribbon crystal 10B. Instead, the jets 32 may be formed from a material that provides no greater than a negligible cooling effect on the growing ribbon crystal 10B.

It should be noted that the specific gas jets 32 can be placed in any number of different locations. For example, rather than (or in addition to) positioning them to cool part or all of the first and second end sections 16 and 20, the gas jets 32 also may be positioned to cool part or all of the middle section 18. As another example, the furnace 22 may have more gas jets 32 on one side of the ribbon crystal 10B than on the other side of the ribbon crystal 10B. The nature of the application thus dictates the number and position(s) of the gas jets 32.

The crucible 26 may be removable from the furnace 22. To do so, when the furnace 22 is shut down, an operator may simply lift the crucible 26 vertically from the furnace 22. To simplify removal, the gas jets 32 preferably are horizontally spaced from the vertical plane of the crucible 26 to facilitate that removal. For example, if the crucible 26 has a width of about 4 centimeters, then the gas jets 32 of a given pair are spaced more than about 4 centimeters apart, thus providing sufficient clearance for easy crucible removal.

Figure 5:
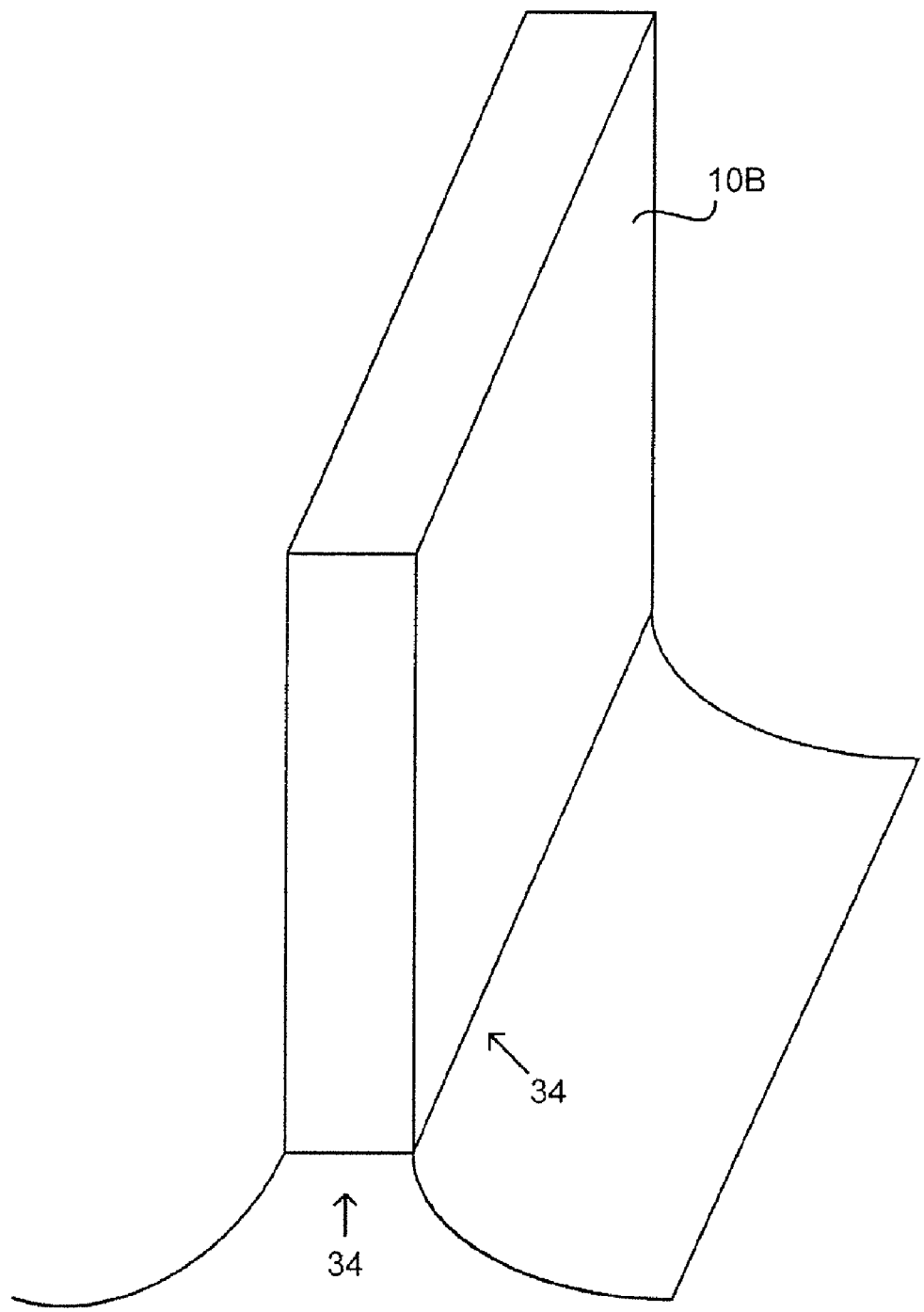
FIG. 5 schematically shows a ribbon crystal in the process of being formed.

Moreover, the vertical position of each gas jet 32 impacts ribbon crystal 10B thickness. Specifically, as background, the point where the growing ribbon crystal 10B meets the molten silicon often is referred to as the "interface." As shown in FIG. 5, the interface 34 effectively forms the top of a meniscus extending vertically upwardly from the top surface of the molten silicon. The height of the meniscus impacts ribbon crystal thickness. In particular, a tall meniscus has a very thin thickness at its top when compared to the thickness at the top of a shorter meniscus.

As known by those skilled in the art, the thickness at and near this area determines the thickness of the growing ribbon crystal 10B. In other words, the thickness of the growing ribbon crystal 10B is a function of the location or height of the interface 34. As also known by those skilled in the art, the temperature of the region around the meniscus controls meniscus/interface 34 height. Specifically, if the temperature of that region is cooler, the meniscus/interface 34 will be lower than if the temperature is warmer.

Accordingly, the cooling effect of the gas jets 32 directly controls the height of the meniscus, which consequently controls the thickness of the growing ribbon crystal 10B. The furnace 22 thus is configured to control the system parameters, such as gas flow rate, temperature the gas flow, spacing of the gas jets 32, etc. . . . , to control the height of the interface 34. This can be varied, either during growth, or before beginning the growth process, to vary the location of the interface 34.

In some embodiments, the gas jets 32 may be movable. For example, the gas jets 32 may be fixedly positioned, but pivotable. As another example, the gas jets 32 may be slidably connected to move horizontally along the furnace 22.

Figure 6:
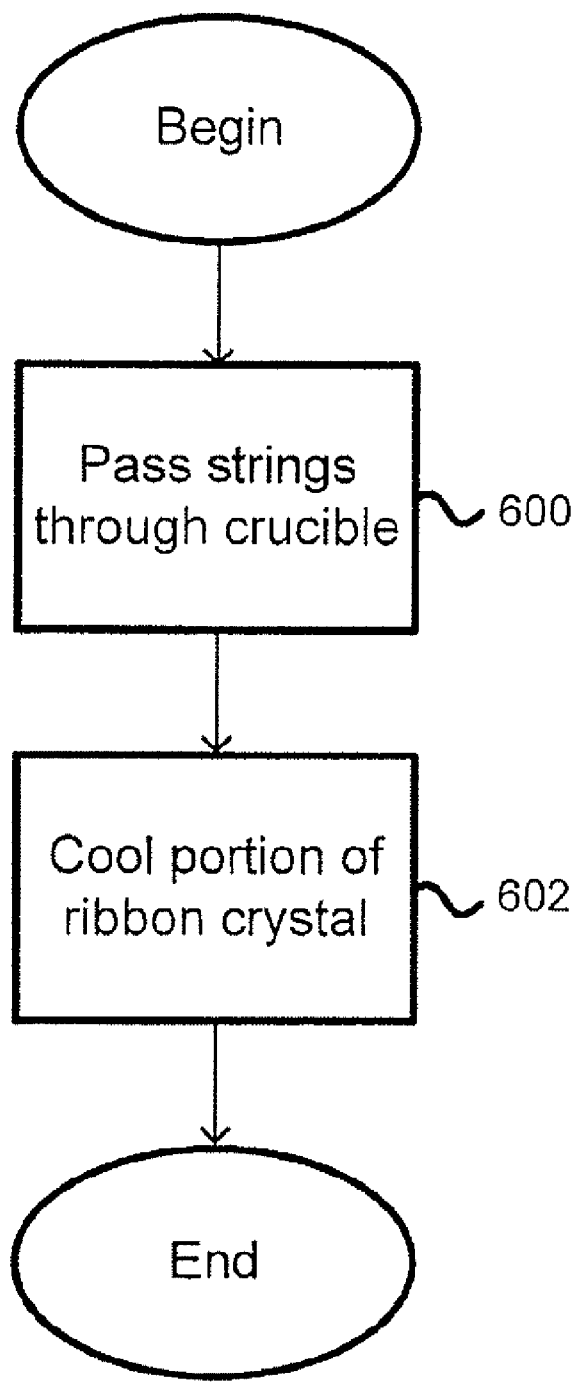
FIG. 6 shows a partial process of forming a ribbon crystal in accordance with illustrative embodiments of the invention.

FIG. 6 shows a partial, simplified process of forming ribbon crystals 10B. Prior to the first step, the crucible 26 is filled with molten silicon. The process thus begins at step 600, which passes strings 14 through the string holes 30 in the crucible 26. As they emerge from the molten silicon, these strings 14 effectively form the growing ribbon crystal 10B.

The process continues to step 602, which cools one or more portions of the growing ribbon crystal 10B. As noted above, the process may convectively cool only, or both convectively cool and radiatively cool.

Accordingly, by convectively cooling the growing ribbon crystal 10B, illustrative embodiments substantially mitigate breakage problems caused by the neck described above. This should increase yield without requiring labor intensive cleaning operations for components that were added for similar purposes.

Although the above discussion discloses various exemplary embodiments of the invention, it should be apparent that those skilled in the art can make various modifications that will achieve some of the advantages of the invention without departing from the true scope of the invention.

What is claimed is:

1. A method of growing a ribbon crystal, the method comprising:
providing a cooling apparatus;
passing at least two strings through a molten material to produce a partially formed ribbon crystal having an end section and a middle section, the end section including one of the at least two strings, the one string and middle section defining a given portion of the partially formed ribbon crystal; and
convectively cooling the given portion of the partially formed ribbon crystal with the cooling apparatus to control the thickness of the given portion.

2. The method as defined by claim 1 wherein convectively cooling comprises causing the thickness of the given portion to be greater than the thickness of the middle section.

3. The method as defined by claim 1 wherein the partially formed ribbon crystal forms an interface with the molten material, wherein convectively cooling comprises varying the convection cooling to vary the location of the interface, the given portion having a thickness that is a function of the location of the interface.

4. The method as defined by claim 1 wherein convectively cooling comprises directing a fluid stream toward the given portion.

5. The method as defined by claim 4 wherein a fluid delivery apparatus directs the fluid stream to strike the given portion, the fluid stream contacting a second portion of the partially formed ribbon crystal after contacting the given portion, the fluid stream cooling the second portion.

6. The method as defined by claim 4 wherein a fluid delivery apparatus directs the fluid stream toward the given portion, the fluid delivery apparatus radiatively cooling the given portion.

7. The method as defined by claim 1 wherein the partially formed ribbon crystal forms an interface with the molten material, further wherein convectively cooling comprises directing a stream of gas to contact a specific location of the given portion, the specific location being spaced from the interface.

8. The method as defined by claim 1 wherein the partially formed ribbon crystal has a ribbon width, the given portion having a width that is no greater than about half the ribbon width.

9. A method of growing ribbon crystal, the method comprising:
providing a crucible containing molten material;
passing at least two strings through the molten material to produce a partially formed ribbon crystal; and
directing a fluid to a given portion of the partially formed ribbon crystal, the fluid convectively cooling the given portion to control the thickness of the given portion.

10. The method as defined by claim 9 wherein the partially formed ribbon crystal has an edge generally defined by one of the strings, the partially formed ribbon crystal also having an inward portion spaced from the edge, the given portion being between the edge and the inward portion, directing comprising causing the thickness of the given portion to be greater than the thickness of the inward portion.

11. The method as defined by claim 9 wherein directing comprises providing a jet that directs the fluid to the given portion, the jet radiatively cooling the given portion.

12. The method as defined by claim 11 wherein the jet directs the fluid stream to strike the given portion, the fluid stream contacting a second portion of the partially formed ribbon crystal after contacting the given portion, the fluid stream cooling the second portion.

13. The method as defined by claim 9 wherein the fluid comprises a gas blown from a jet toward the given portion, the gas being at a temperature of between about 100-400 degrees C.

14. The method as defined by claim 9 wherein the partially formed ribbon crystal forms an interface with the molten material, further wherein the fluid contacts a specific location of the given portion, the specific location being spaced from the interface.

15. An apparatus for forming a ribbon crystal, the ribbon crystal having an end section and a middle section, the end section including a string, the string and middle section defining a given portion of the partially formed ribbon crystal, the apparatus comprising:
a crucible for containing molten material, the crucible forming a string hole for passing string through the molten material for growing the ribbon crystal; and
a gas jet having an outlet port facing inwardly for directing a gas generally inwardly toward the given portion of the growing ribbon crystal to control the thickness of the given portion.

16. The apparatus as defined by claim 15 wherein the gas jet comprises a radiatively cooling material.

17. The apparatus as defined by claim 16 wherein the radiatively cooling material comprises graphite.

18. The apparatus as defined by claim 15 wherein the gas jet is horizontally spaced from the crucible.

19. The apparatus as defined by claim 15 further comprising a second gas jet, the first gas jet directing gas in a first direction, the second gas jet directing gas in a second direction, the first and second directions being different directions and generally parallel.

20. The apparatus as defined by claim 19 wherein the first gas jet and second gas jet produce respective gas streams that are generally coaxial.

21. The apparatus as defined by claim 15 further comprising a string through the string hole and a growing ribbon crystal.

* * * * *